United States Patent
Nakai

(10) Patent No.: US 7,590,012 B2
(45) Date of Patent: Sep. 15, 2009

(54) SEMICONDUCTOR STORAGE DEVICE

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 200 days.

(21) Appl. No.: 11/845,605

(22) Filed: Aug. 27, 2007

(65) Prior Publication Data
US 2008/0062805 A1 Mar. 13, 2008

(30) Foreign Application Priority Data
Sep. 12, 2006 (JP) ............................ 2006-247109

(51) Int. Cl.
G11C 7/00 (2006.01)
(52) U.S. Cl. ........................ 365/189.16; 365/189.09; 365/226
(58) Field of Classification Search ............ 365/189.16, 365/230.03, 189.09, 226
See application file for complete search history.

(56) References Cited

U.S. PATENT DOCUMENTS

| | | | | |
|---|---|---|---|---|
| 5,289,431 | A | * | 2/1994 | Konishi .................. 365/230.03 |
| 6,144,584 | A | * | 11/2000 | Kunori et al. .......... 365/185.18 |
| 6,940,777 | B2 | * | 9/2005 | Ooishi ........................ 365/226 |

FOREIGN PATENT DOCUMENTS

| | | |
|---|---|---|
| JP | 2000-285690 A | 10/2000 |
| JP | 2000-299383 A | 10/2000 |
| JP | 2004-171625 A | 6/2004 |
| JP | 2006-202383 A | 8/2006 |

OTHER PUBLICATIONS

Sangbeom Kang et al., "A 0.1 μm 1.8V 256MB 66MHz Synchronous Burst PRAM", 2006 IEEE International Solid-State Circuit Conference, pp. 140-141, Feb. 2006.

* cited by examiner

Primary Examiner—Son Dinh
(74) Attorney, Agent, or Firm—Sughrue Mion, PLLC

(57) ABSTRACT

Semiconductor storage device of reduced layout area having memory cell rows accessed selectively. Memory cells, each including a programmable resistive element, are connected by a bit line to form a memory cell row. Selecting circuit for selecting a memory cell row includes a first NMOS transistor having first end connected to write amplifier, second end connected to the bit line, and a gate, and controlled such that, if the write amplifier outputs a voltage level on power-supply side after the block-select activating signal has been activated, a voltage of the same polarity as that of the power-supply voltage and exceeding the voltage level of the power supply is applied to the gate. A second NMOS transistor has first end to which the block-select activating signal is applied, a gate connected to the power supply, and second end connected to the gate of the first NMOS transistor.

19 Claims, 5 Drawing Sheets

SEMICONDUCTOR STORAGE DEVICE

REFERENCE TO RELATED APPLICATION

This application is based upon and claims the benefit of the priority of Japanese patent application No. 2006-247109, filed on Sep. 12, 2006, the disclosure of which is incorporated herein in its entirety by reference thereto.

FIELD OF THE INVENTION

This invention relates to a semiconductor storage device and, more particularly, to a semiconductor storage device in which memory cells are accessed selectively.

DESCRIPTION OF RELATED ART

A phase-change memory (PRAM) stores data by controlling Joule heat, which is produced by passing a current into a phase-change material (GeSbTe), and changing the crystalline state of the phase-change material to a low-resistance crystalline state (the set state) and high-resistance amorphous state (the reset state). In order to establish the reset state, it is necessary to apply a high voltage to the element and pass a current required for reset. On the other hand, a write amplifier connected to a bit line in order to supply the write current requires a circuit for controlling reset write and set write. Since it is necessary to supply the current needed for reset, layout size is large. Furthermore, a sense amplifier for reading data that has been written to the phase-change element also requires the adoption of a current sensing system. The number of elements is greater, therefore, than in a latch-type amplifier generally used in a DRAM and this enlarges layout size. This means that if one sense amplifier and one write amplifier are provided for one bit line, the area of the device will be extremely large. Further, in a case where a SRAM-compatible memory is produced, the number of write bits in one cycle as small as 16 bits, which is the same as the number input/outputs. This makes it necessary to hierarchically organize the bit lines to thereby reduce the number of these circuits provided.

In a case where such a hierarchical bit-line structure is adopted, a selecting circuit (block selecting circuit) for selecting a bit line is required between bit lines and sections for sense amplifiers/write amplifiers. In the case of a PRAM, the selecting circuit uses a CMOS-type switch owing to the need to assure the element write voltage (see Non-Patent Document 1). In accordance with a CMOS-type switch, a high voltage can be applied to a bit line in order to pass a sufficient current (an order of 500 μA to 1 mA) for writing to a phase-change element.

FIG. 4 is a circuit diagram illustrating a write bus described in Non-Patent Document 1. In FIG. 4, a boosted voltage VPP_WD is applied to a selecting circuit SEL via an NMOS transistor Q1 that has been turned ON by a write signal WD. The selecting circuit SEL is constituted by a CMOS-type switch comprising an NMOS transistor Q2 and a PMOS transistor Q3. The switch is turned ON and OFF by global column select signals GY, /GY. If the switch is turned ON, the voltage VPP_WD is applied to a phase-change element GST via an NMOS transistor Q4, which serves as a local column switch, turned ON and OFF by a local column select signal LY. The resistive element serving as the phase-change element GST is connected to an NMOS transistor Q5 turned ON and OFF by a word line signal WL. Selection and writing are performed by the word line signal WL, global column select signals GY, /GY and local column select signal LY.

As related art, Patent Document 1 describes a semiconductor device having an anti-fuse circuit that readily lends itself to blow control.

[Non-Patent Document 1]
Sangbeom Kang et al., "A 0.1 μm 1.8V 256 MB 66 MHz Synchronous Burst PRAM", 2006 IEEE International Solid-State Circuit Conference, pp. 140-141, February 2006
[Patent Document 1]
JP Patent Kokai Publication No. JP-P2000-299383A

SUMMARY OF THE DISCLOSURE

The following analysis is given by the present invention. The disclosure of the above-mentioned Non-Patent Document 1 and Patent Document 1 are herein incorporated by reference thereto.

FIG. 5 is a diagram schematically illustrating the layout of a semiconductor device in a CMOS-type selecting circuit. As shown in FIG. 5, a P substrate has an N-well region 100. Further, the N-well region 100 is provided with a p+ diffusion layer region 101, and the P substrate is provided with an n+ diffusion layer region 102. By way of example, the n+ diffusion layer region 102 and p+ diffusion layer region 101 constitute the NMOS transistor Q2 and PMOS transistor Q3, respectively, of FIG. 4. First ends of the NMOS transistor Q2 and PMOS transistor Q3 are connected in common with a global bit line GBL, and second ends thereof are connected in common with a local bit line LBL. Further, the global column select signals GY, /GY are applied to gates of the NMOS transistor Q2 and PMOS transistor Q3, respectively.

In a case where a CMOS-type switch is used in the selecting circuit SEL, the P-well region (P substrate) and N-well region 100 are provided and it becomes necessary to provide a well isolation region 103 between them. Further, since the PMOS transistor Q3, which has a low driving ability, serves as the main path of current in the high-voltage region, the layout size of the PMOS transistor Q3 is large. Furthermore, wiring for the global column select signals GY, /GY, which are complementary signals, is necessary in order to control the gates of the CMOS-type switch. If the number of wiring traces increases, so does the layout area. It should be noted that although it is possible to adopt an implementation using a NMOS-type switch, it is required that the gate voltage of the NMOS transistors constituting the switch be made a high voltage. This means making use of MOS transistors having a thick oxide film. Furthermore, in order to apply a high voltage, use is made of MOS transistors having a thick gate oxide film, as a result of which driving capability declines. In order to compensate for this, gate width must be enlarged. The end result is the likelihood of an increase in layout size. Thus there is much to be desired in the art.

According to a first aspect of the present invention there is provided a semiconductor storage device comprising: a plurality of memory cell rows each of which includes a plurality of memory cells provided at intersections between a bit line and a word line, memory cells in each of said memory cell rows being connected by the bit line; a write amplifier; and a selecting circuit that selectively connects one of the memory cell rows to the write amplifier via a bit line by a block-select activating signal. The selecting circuit includes a first MOS transistor having a first end connected to the write amplifier, a second end connected to the bit line, and a control end, so as to be controlled in such a manner that if the write amplifier outputs a voltage level on a power-supply side after the block-select activating signal has been activated, a voltage of the same polarity as that of the voltage on the power-supply side and exceeding the voltage level is applied to the control end.

In the semiconductor device according to the invention, it is preferred that the selecting circuit further include a second MOS transistor of the same conductivity type as that of the first MOS transistor, having a first end to which the block-select activating signal is applied, a control end connected to the power-supply side, and a second end connected to the control end of the first MOS transistor.

In the semiconductor device according to the invention, it is preferred that each memory cell includes a programmable resistive element.

In the semiconductor device according to the invention, it is preferred that the programmable resistive element is a phase-change element.

In the semiconductor device according to the invention, it is preferred that the programmable resistive element is a tunnel magnetoresistive element.

It is preferred that the second MOS transistor has a substantially smaller gate size than that of the first MOS transistor. The second MOS transistor may have a gate extending in a direction transverse to that of the gate of the first MOS transistor. The control end of the second MOS transistor may be a gate which is formed as a part of a power supply line per se.

According to a second aspect of the present invention there is provided a semiconductor storage device comprising: a plurality of memory cell rows each of which includes a plurality of memory cells provided at intersections between a bit line and a word line, memory cells in each of the memory cell rows being connected by the bit line; a write amplifier; and a selecting circuit that selectively connects one of the memory cell rows to the write amplifier via a bit line by a block-select activating signal; wherein the selecting circuit includes a first MOS transistor and a second MOS transistor having the same conductivity type, the first MOS transistor having a first end connected to the write amplifier, a second end connected to the bit line, and a control gate; the second MOS transistor having a first end to which the block-select activating signal is applied, a control end connected to the power-supply side, and a second end connected to the control gate of the first MOS transistor The meritorious effects of the present invention are summarized as follows.

In accordance with the present invention, the selecting circuit can be made a circuit having a high driving capability through use of low-withstand-voltage MOS transistors of the same-conductivity-type serving as a self-boost-type circuit, which results in a substantially smaller and reduced layout space of the (block) selecting circuits. This leads to substantial reduction in the layout size of the entire semiconductor storage device.

Other features and advantages of the present invention will be apparent from the following description taken in conjunction with the accompanying drawings, in which like reference characters designate the same or similar parts throughout the figures thereof.

PREFERRED MODES OF THE INVENTION

Figure 1:
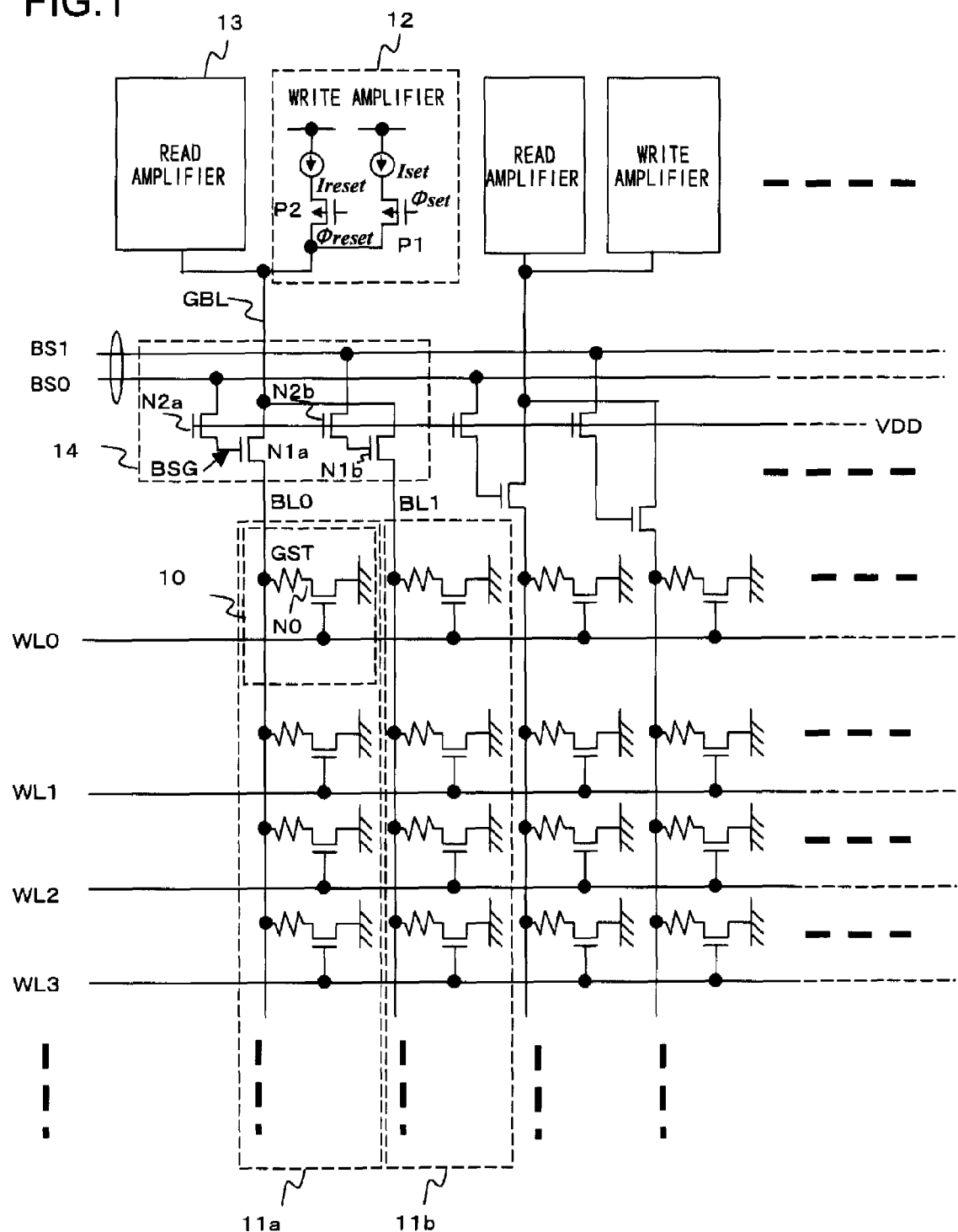
FIG. 1 is a circuit diagram illustrating the main portion of a semiconductor storage device according to an example of the present invention.

A semiconductor storage device according to an exemplary embodiment of the present invention has memory cells (10 in FIG. 1) at the intersections of bit lines (BL0, BL1, . . . in FIG. 1) and word lines (WL0, WL1, . . . in FIG. 1). Each memory cell includes a programmable resistive element (GST in FIG. 1) such as a phase-change element or tunnel magnetoresistive element. A plurality of memory cells are connected by a bit line and construct a memory cell row 11a (11a in FIG. 1). The semiconductor storage device further includes a selecting circuit (14 in FIG. 1) for selectively connecting a plurality of the memory cell rows to a write amplifier (12 in FIG. 1) and read amplifier (13 in FIG. 1).

The selecting circuit (block selecting circuit) includes an NMOS transistor (N1a in FIG. 1) constructing a self-boost circuit and having a first end connected to the write amplifier and read amplifier, a second end connected to a bit line, and a gate, and adapted in such a manner that if the write amplifier outputs the voltage level of the power-supply side after a block-select activating signal (BS0 in FIG. 1) has been activated, a voltage of the same polarity as that of the voltage on the power-supply side (VDD in FIG. 1) and exceeding the level of the power-supply voltage (VDD) is applied to the gate. The selecting circuit further includes a NMOS transistor (N2a in FIG. 1) having one end to which the block-select activating signal (BS0) is applied, a gate connected to the power-supply side (VDD in FIG. 1), and a second end connected to the gate of the NMOS transistor (N1a in FIG. 1).

The semiconductor storage device thus constructed is advantageous in terms of layout because the MOS transistors of the switch can all be implemented by NMOS transistors, i.e. MOS transistors of the same polarity. Further, since the device is constituted by the self-boost circuit(s), a voltage greater than a voltage allowed by these MOS transistors is not applied across the source and gate. Accordingly, since MOS transistors having a thin gate oxide film can be used, the current driving capability of the switch can be increased without enlarging layout area.

In accordance with the semiconductor storage device of this exemplary embodiment, a circuit having a high current driving capability can be constructed solely by NMOS transistors by using a self-boost-type selecting circuit. Further, since the selecting circuit is constructed solely by NMOS transistors, the layout area can be reduced in comparison with a CMOS-type circuit. Furthermore, since a high voltage is not applied between the gate and source and between the gate and drain in the selecting circuit, it is possible to use MOS transistors having a thin gate oxide film. That is, rather than an arrangement in which the gates of the NMOS transistors are simply raised to a high voltage type, the current driving capability can be enlarged by using the MOS transistors of the same size. Moreover, although it is necessary to apply a high voltage to the gates in order to assure a good current driving capability in a case where a selecting circuit is constructed using only NMOS transistors, it is no longer necessary to separately provide a high-voltage generating circuit in the case of the self-boost circuit, and current consumption for driving the gates can be reduced. An example of the present invention will now be described in detail with reference to the drawings.

FIRST EXAMPLE

FIG. 1 is a circuit diagram illustrating the main portion of a semiconductor storage device according to an example of the present invention. As shown in FIG. 1, the semiconductor storage device includes memory cells 10 each cell being disposed at every intersection between each of bit lines BL0, BL1, . . . and each of word lines WL0, WL1, . . . . Each memory cell 10 includes a programmable resistive element GST such as a phase-change element or tunnel magnetoresistive element, and an NMOS transistor N0 having a first end connected to ground, a second end connected to the resistive element GST, and a control end connected to the word line WL0. A plurality of the memory cells, grouped in a first row are connected by a first one of the bit lines BL0 and to construct a memory cell row 11a. A plurality of the memory cells, grouped in a second row are connected by a second one of the bit lines BL1 to construct a memory cell row 11b. A selecting circuit 14 is provided for selectively connecting the two memory cell rows 11a, 11b to a write amplifier 12 and read amplifier 13. The memory cell rows, write amplifier and read amplifier make up a set, and a number of such sets are arranged in parallel.

The write amplifier 12 includes current sources Iset, Ireset, which generate write currents for writing to the memory cells, and PMOS transistors P1, P2 that turn the write current ON and OFF. The current from the current source Iset is supplied to a global bit line GBL by the PMOS transistor P1 turned on by a set signal Φset. The current from the current source Ireset is supplied to the global bit line GBL by the PMOS transistor P2 turned on by a reset signal Φreset. The read amplifier 13 reads out a resistance value in a memory cell as a current value via the global bit line GBL.

The selecting circuit 14 selects one of the bit lines BL0, BL1 and connects it to the write amplifier 12 and read amplifier 13 as the global bit line GBL. For example, the selecting circuit 14 selects the bit line BL0 if a bit-line select signal BS0 is at the high level (active) and selects the bit line BL1 if a bit-line select signal BS1 is at the high level (active). It should be noted that although an example in which two bit lines are selected has been illustrated, it is of course possible to select from among four bit lines, eight bits or more. This will be decided by the specifications of the products, etc., depending upon needs.

The selecting circuit 14 includes NMOS transistors N1a, N2a; and N1b, N2b. First ends of the NMOS transistors N1a, N1b are connected in common with the write amplifier 12 and read amplifier 13 via the global bit line GBL. The second end of the NMOS transistor N1a is connected to the bit line BL0, and the second end of the NMOS transistor N1b is connected to the bit line BL1. The NMOS transistor N2a has a first end to which the block-select activating signal BS0 is applied, a gate connected to a power supply VDD, and a second end connected to the gate of the NMOS transistor N1a. The NMOS transistor N2b has a first end to which a block-select activating signal BS1 is applied, a gate connected to the power supply VDD, and a second end connected to the gate of the NMOS transistor N1b.

If the write amplifier 12 outputs a voltage level on the power-supply side after the block-select activating signal BS0 has been activated, a voltage that exceeds the voltage level on the power-supply side is applied to the gate of the NMOS transistor N1a in the selecting circuit 14, and hence the NMOS transistor N1a forms a self-boost circuit. That is, the gate of the NMOS transistor N2a is fixed at the voltage of the power supply VDD and the gate voltage BSG of the NMOS transistor N1a takes on the level of VDD-Vth (the threshold value of the NMOS transistor). When a signal of amplitude VDD is input from the side of the write amplifier 12 under these conditions, the gate voltage BSG of the NMOS transistor N1a rises to the level of 2VDD-Vth. As a result of the gate of NMOS transistor N1a being boosted to a high voltage in this manner, the current driving capability of the NMOS transistor N1a is assured. Similarly, the NMOS transistor N1b constructs a self-boost circuit if the block-select activating signal BS1 is activated.

Figure 2:
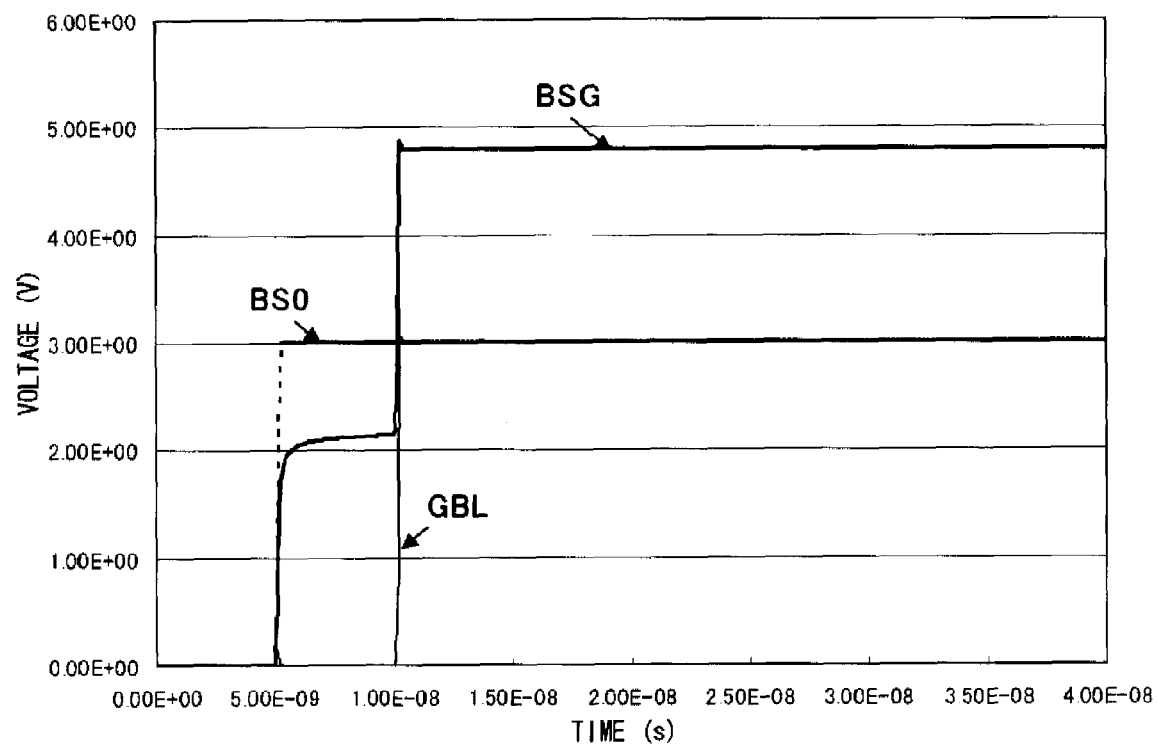
FIG. 2 is a diagram illustrating operation waveforms in a selecting circuit according to an example.

FIG. 2 is a diagram illustrating operation waveforms in the selecting circuit according to an example of the invention. The bit-line select signal BS0 is placed at a high level (e.g. 3V) in FIG. 2. At this time the gate of NMOS transistor N2a is at the VDD level (e.g. 3V) and therefore the voltage BSG at the gate of NMOS transistor N1a rises to only VDD-Vth (e.g. about 2.1V). If a write pulse enters the global bit line GBL after the level at the gate of NMOS transistor N1a has stabilized at VDD-Vth, the gate level of NMOS transistor N1a rises to 2VDD-Vth (about 4.8 V) owing to coupling with the gate of the NMOS transistor N1a. Since a gate voltage higher than the voltage of the power supply can thus be obtained, the NMOS transistor N1a is capable of assuring a high driving capability with respect to writing to the memory cells.

It should be noted that by applying a voltage higher than VDD to the gate, similar effects could be obtained without adopting the self-boost arrangement. In this case, however, a voltage higher than VDD would be applied between the gate and the source/drain. Accordingly, since it would be necessary to increase the thickness of the gate oxide film in conformity with the voltage applied, the current driving capability of the MOS transistors would generally declines. If the self-boost arrangement is adopted, on the other hand, a voltage higher than VDD is not applied between the gate and the source/drain. Accordingly, by employing MOS transistors that are usable at the voltage of VDD, an advantage obtained is that driving current capability is assured. When the same current is assured, the self-boost arrangement is better in terms of reducing layout area.

Figure 3A:
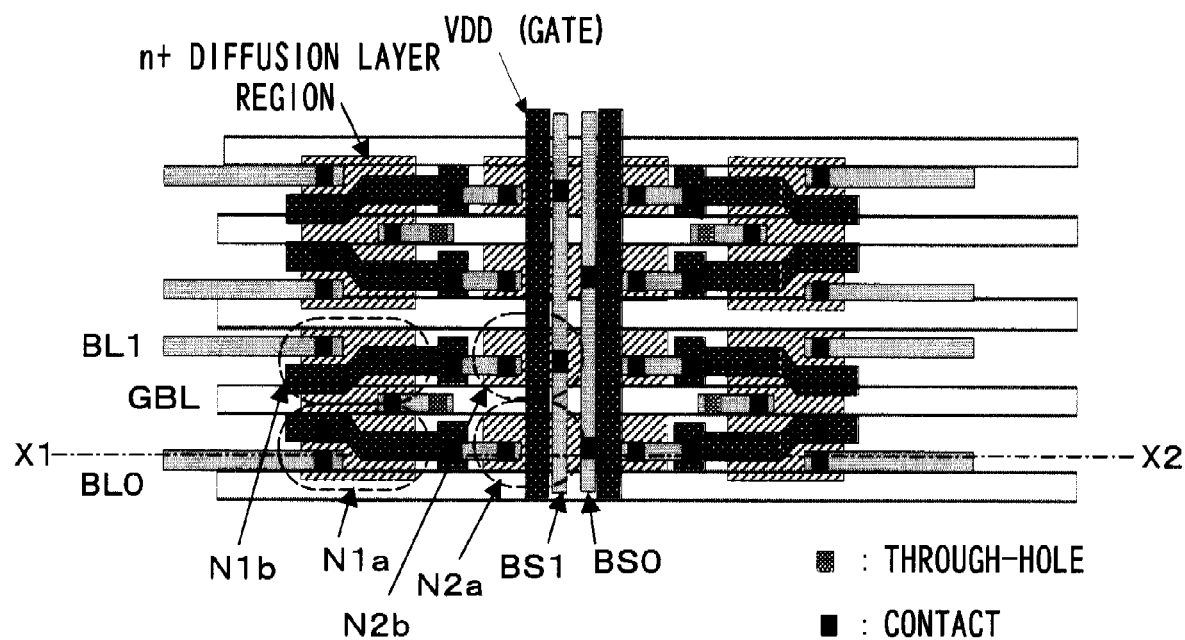
FIG. 3A is a diagram illustrating the layout in the selecting circuit of the semiconductor storage device according to an example and FIG. 3B is a cross sectional view taken along the line X1-X2 in FIG. 3A.
Figure 3B:
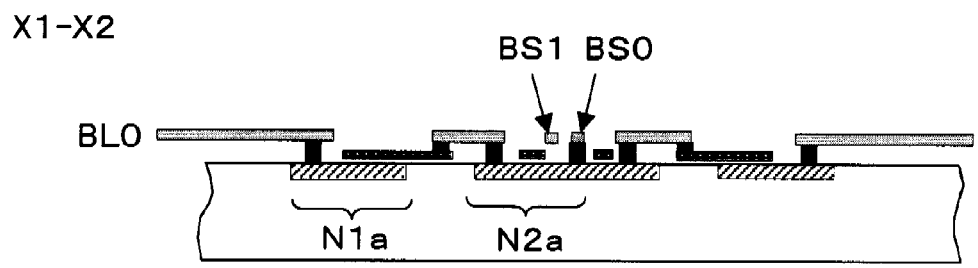
Figure 4:
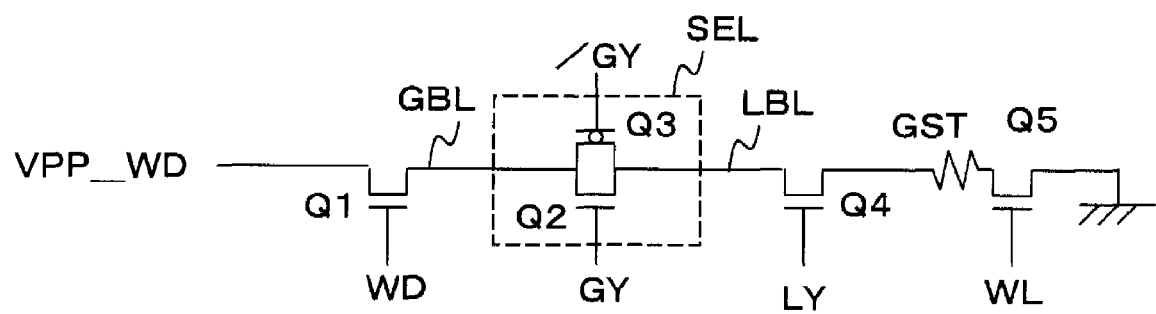
FIG. 4 is a circuit diagram illustrating a write bus described in Non-Patent Document 1.

FIG. 3A is a diagram illustrating the layout in the selecting circuit of the semiconductor storage device according to an example of the invention. In FIG. 3A, the switching NMOS transistors N1a, N1b are placed on the side of the local bit lines BL0, BL1, and the NMOS transistors N2a, N2b for boosting gate voltage are placed alongside the transistors N1a, N1b, respectively. Since the MOS transistors N2a, N2b do not lie in the main path of current and, as mentioned above, need only have a low withstand voltage, size can be reduced. Further, since this selecting circuit does not use PMOS transistors of the kind depicted in FIG. 5, layout area can be reduced in comparison with FIG. 5. Furthermore, since the layout can be implemented solely with NMOS transistors, a well isolation region can be dispensed with and a layout of small area can be obtained. FIG. 3B is a cross sectional view taken along the line X1-X2 in FIG. 3A, from which the layer structure is apparent and simple.

In more detail, as shown in FIG. 3, a pair of the local bit lines BL0 and BL1 extend in parallel, intervened with a global bit line GBL, up to a position just overlapping the n+ diffusion layer region common for the switching NMOS transistors N1a and N1b such that the NMOS transistors N1a and N1b are placed sandwiched by the pair of the local bit lines BL0 and BL1 alongside therewith, respectively. Each gate of the NMOS transistors N1a and N1b is disposed in the area, of the n+diffusion layer, sandwiched by the pair of local bit lines BL0 and BL1, and extending further away from the end of the respective local bit lines BL0, BL1 in the same direction thereof.

The gate layer band trace for each of the NMOS transistors N1a and N1b extends toward the n+ diffusion layer region for the NMOS transistor N2a or N2b, respectively, and connected thereto via an interconnection. The common gate layer band trace (VDD) of the NMOS transistors N2a and N2b extends in a direction (vertically in the figure) transverse to each n+ diffusion layer region of the NMOS transistor N2a or N2b. Alongside the common gate layer band trace, a pair of block select signal lines BS1 and BS0 are disposed, along which another common gate layer band trace of NMOS transistors belonging to a neighboring (block) selecting circuit for neighboring memory cell row extends (vertically in the figure).

The electrical connections are established by way of contacts and through holes (vias) disposed interlayerwise, so that the (block) selecting circuit 14 as shown in FIG. 1 is formulated. As is apparent in FIG. 3, the n+ diffusion layer region for the NMOS transistors N2a and N2b is substantially smaller than that for the switching NMOS transistors N1a or N1b, resulting in a substantially smaller layout space thereof. Besides, the local bit lines BL0 and BL1 do not extend throughout an area over the n+ diffusion layer region of the switching NMOS transistors N1a and N1b, and that for the NMOS transistors N2a and N2b, respectively.

Figure 5:
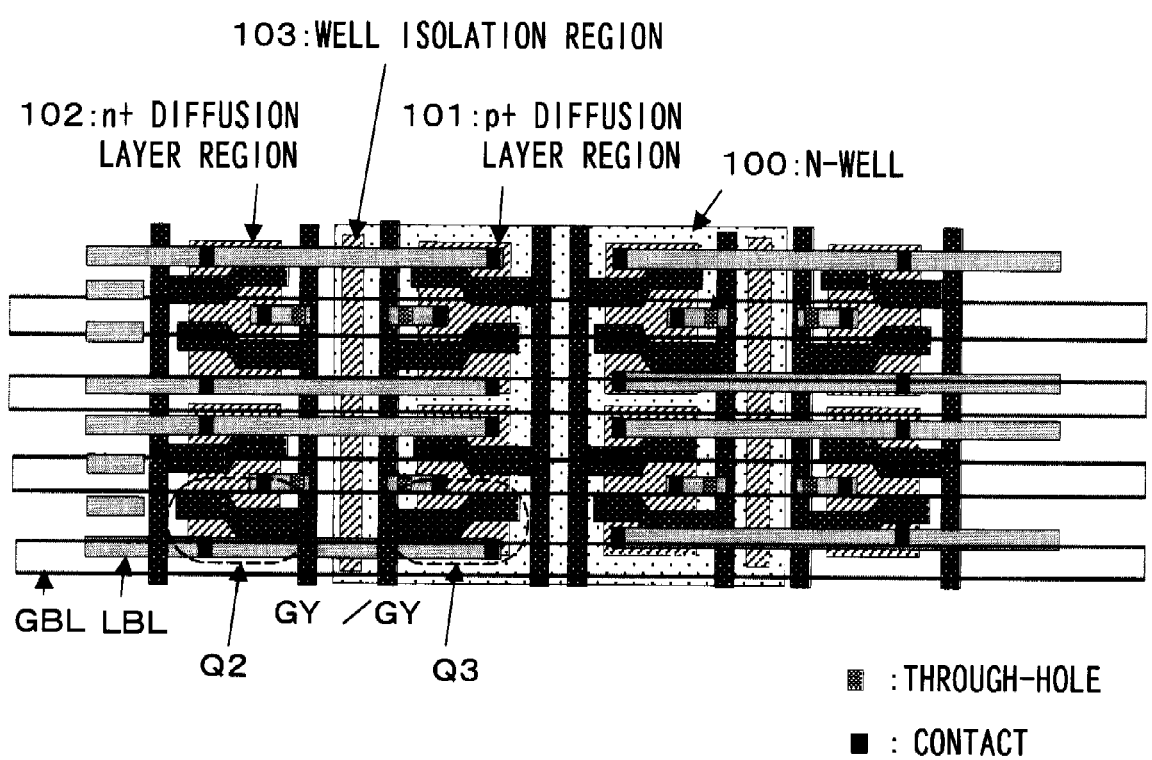
FIG. 5 is a diagram schematically illustrating the layout of a semiconductor device in a CMOS-type selecting circuit.

As for the conventional CMOS configuration as shown in FIG. 5, it includes the n+ diffusion layer region 102 for transistor Q2 and the p+ diffusion layer region 101 for transistor Q3, separated by the intervening well separation region 103. The local bit lines LBL extend in parallel throughout/ over the n+ diffusion layer region 102 and the p+ diffusion layer region 101 of the CMOS circuit. In summary, this formulation results in an essentially larger layout space, particularly with respect to the gate width (or two-dimensional gate size) on the p+ diffusion layer region for PMOS transistor Q3, as compared to the example of the present invention.

In the description rendered above, the programmable resistive element GST is not limited to a PRAM (phase-change memory), and the invention can be applied in similar fashion to bit-line selection requiring the passage of a high current into a write bit line with regard to a tunnel magnetoresistive element such as an MRAM (Magnetosensitive Random-Access Memory).

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
    a plurality of memory cell rows each of which includes a plurality of memory cells provided at intersections between a bit line and a word line, memory cells in each of said memory cell rows being connected by the bit line;
    a write amplifier; and
    a selecting circuit that selectively connects one of said memory cell rows to said write amplifier via a bit line by a block-select activating signal;
    wherein said selecting circuit includes a first MOS transistor having a first end connected to said write amplifier, a second end connected to the bit line, and a control end, so as to be controlled in such a manner that if said write amplifier outputs a voltage level on a power-supply side after the block-select activating signal has been activated, a voltage of the same polarity as that of the voltage on the power-supply side and exceeding the voltage level is applied to the control end.

2. The device according to claim 1, wherein said selecting circuit further comprises a second MOS transistor of the same conductivity type as that of said first MOS transistor, having a first end to which the block-select activating signal is applied, a control end connected to the power-supply side, and a second end connected to the control end of the first MOS transistor.

3. The device according to claim 1, wherein each memory cell includes a programmable resistive element.

4. The device according to claim 2, wherein each memory cell includes a programmable resistive element.

5. The device according to claim 3, wherein said programmable resistive element is a phase-change element.

6. The device according to claim 4, wherein said programmable resistive element is a phase-change element.

7. The device according to claim 3, wherein said programmable resistive element is a tunnel magnetoresistive element 8. The device according to claim 4, wherein said programmable resistive element is a tunnel magnetoresistive element.

9. The device according to claim 2, wherein said second MOS transistor has a substantially smaller gate size than that of the first MOS transistor.

10. The device according to claim 4, wherein said second MOS transistor has a gate extending in a direction transverse to that of the gate of the first MOS transistor.

11. The device according to claim 2, wherein said control end of said second MOS transistor comprises a gate which is formed as a part of a power supply line per se.

12. A semiconductor storage device comprising:
    a plurality of memory cell rows each of which includes a plurality of memory cells provided at intersections between a bit line and a word line, memory cells in each of said memory cell rows being connected by the bit line;
    a write amplifier; and
    a selecting circuit that selectively connects one of said memory cell rows to said write amplifier via a bit line by a block-select activating signal;
    wherein said selecting circuit includes a first MOS transistor and a second MOS transistor having the same conductivity type,
    said first MOS transistor having a first end connected to said write amplifier, a second end connected to the bit line, and a control gate;
    said second MOS transistor having a first end to which the block-select activating signal is applied, a control end connected to the power-supply side, and a second end connected to the control gate of the first MOS transistor.

13. The device according to claim 12, wherein said second MOS transistor has a substantially smaller gate size than that of the first MOS transistor.

14. The device according to claim 12, wherein said control gate of the second MOS transistor extends in a direction transverse to that of said control gate of the first MOS transistor.

15. The device according to claim 12, wherein said control gate of the second MOS transistor is formed as a part of a power supply line per se.

16. The device according to claim 12, wherein said selecting circuit is controlled in such a manner that if said write amplifier outputs a voltage level on a power-supply side after the block-select activating signal has been activated, a voltage of the same polarity as that of the voltage on the power-supply side and exceeding the voltage level is applied to the control gate of said first MOS transistor.

17. A semiconductor storage device comprising:
a plurality of memory cell rows each of which includes a plurality of memory cells provided at intersections between a bit line and a word line, memory cells in each of said memory cell rows being connected by the bit line;
a write amplifier; and
a selecting circuit that selectively connects one of said memory cell rows to said write amplifier via a bit line by a block-select activating signal;
wherein said selecting circuit includes first and second MOS transistors having the same conductivity type;
said first MOS transistor having a first end connected to said write amplifier, a second end connected to the bit line, and a control gate;
said second MOS transistor having a first end to which the block-select activating signal is applied, a control gate connected to the power-supply side, and a second end connected to the control gate of the first MOS transistor;
said control gate of the second MOS transistor being substantially smaller in size that of the first MOS transistor.

18. The device according to claim 17, wherein said control gate of the second MOS transistor extends in a direction transverse to that of the control gate of the first MOS transistor.

19. The device according to claim 18, wherein said control gate of the second MOS transistor is formed as a part of a power supply line per se.

* * * * *